United States Patent
Liu et al.

(10) Patent No.: US 12,016,227 B2
(45) Date of Patent: Jun. 18, 2024

(54) DISPLAY PANEL, PREPARATION METHOD THEREOF, AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Hao Liu, Beijing (CN); Xuewu Xie, Beijing (CN); Shi Sun, Beijing (CN); Yu Ai, Beijing (CN); Bowen Liu, Beijing (CN); Yubao Kong, Beijing (CN); Ameng Zhang, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 718 days.

(21) Appl. No.: 17/268,091

(22) PCT Filed: Jun. 29, 2020

(86) PCT No.: PCT/CN2020/099008
§ 371 (c)(1),
(2) Date: Feb. 12, 2021

(87) PCT Pub. No.: WO2021/017722
PCT Pub. Date: Feb. 4, 2021

(65) Prior Publication Data
US 2021/0328003 A1    Oct. 21, 2021

(30) Foreign Application Priority Data
Jul. 26, 2019  (CN) .......................... 201910682890.1

(51) Int. Cl.
*H01L 27/32* (2006.01)
*H01L 51/52* (2006.01)
(Continued)

(52) U.S. Cl.
CPC ....... *H10K 59/1315* (2023.02); *H10K 50/824* (2023.02); *H10K 59/122* (2023.02); *H10K 71/00* (2023.02)

(58) Field of Classification Search
None
See application file for complete search history.

(56) References Cited

U.S. PATENT DOCUMENTS

2016/0043341 A1   2/2016  Heo et al.
2016/0149155 A1   5/2016  Kim
(Continued)

FOREIGN PATENT DOCUMENTS

CN    103700780 A      4/2014
CN    105590954 A  *  5/2016  ......... H01L 27/3246
(Continued)

OTHER PUBLICATIONS

English-language machine-made translation of CN-105590954-A.*
Chinese Office Action for corresponding 201910682890.1.
Chinese Office Action for corresponding 201910682890.1 issued Jun. 4, 2021.

*Primary Examiner* — Robert K Carpenter
(74) *Attorney, Agent, or Firm* — ArentFox Schiff LLP; Michael Fainberg

(57) ABSTRACT

Disclosed in embodiments of the present disclosure are a display panel, a preparation method thereof, and a display device. A display panel having a display area and a non-display area includes: a base substrate; an auxiliary electrode in the non-display area; a passivation layer disposed on a side of the auxiliary electrode facing away from the base substrate, having a first opening in the non-display area, in the first opening, an accommodating space is formed between the passivation layer and the auxiliary electrode, the accommodating space exposes part of the auxiliary electrode; an orthographic projection of the passivation layer on the base substrate covers an orthographic projection of the
(Continued)

accommodating space on the base substrate; a cathode layer disposed on a side of the passivation layer facing away from the base substrate, having a connecting portion in the accommodating space, the connecting portion being connected to the auxiliary electrode.

10 Claims, 4 Drawing Sheets

(51) Int. Cl.
*H01L 51/56* (2006.01)
*H10K 50/824* (2023.01)
*H10K 59/122* (2023.01)
*H10K 59/131* (2023.01)
*H10K 71/00* (2023.01)

(56) References Cited

U.S. PATENT DOCUMENTS

| | | | |
|---|---|---|---|
| 2016/0293888 A1 | 10/2016 | Shim et al. | |
| 2017/0062755 A1 | 3/2017 | Im et al. | |
| 2017/0133619 A1* | 5/2017 | Hasegawa | H10K 59/173 |
| 2018/0151831 A1 | 5/2018 | Lee et al. | |
| 2020/0135838 A1* | 4/2020 | Han | H10K 59/122 |

FOREIGN PATENT DOCUMENTS

| | | |
|---|---|---|
| CN | 106057844 A | 10/2016 |
| CN | 106206645 A | 12/2016 |
| CN | 106486606 A | 3/2017 |
| CN | 108155299 A | 6/2018 |
| CN | 109830610 A | 5/2019 |
| CN | 110311056 A | 10/2019 |

* cited by examiner

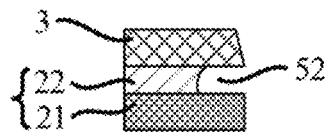
Fig. 5B
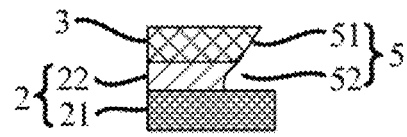
Fig. 5C
| Successively forming a pattern of an auxiliary electrode and a pattern of a passivation layer over a base substrate | 101 |
↓
| Applying a voltage to the auxiliary electrode | 102 |
↓
| Evaporating a cathode material on the passivation layer | 103 |
Fig. 6

DISPLAY PANEL, PREPARATION METHOD THEREOF, AND DISPLAY DEVICE

CROSS REFERENCE TO RELATED APPLICATIONS

The present disclosure is a National Stage of International Application No. PCT/CN2020/099008, filed Jun. 29, 2020, which claims the priority from Chinese Patent Application No. 201910682890.1 filed with the China National Intellectual Property Administration on Jul. 26, 2019 and entitled 'Display Panel, Preparation Method Thereof, and Display Device', the entire contents of which are incorporated herein by reference.

FIELD

The present disclosure relates to the field of display technology, in particular to a display panel, a preparation method thereof, and a display device.

BACKGROUND

Emergent light from a top-emitting organic light-emitting diode (OLED) display panel is emergent from a side of a cathode layer. The cathode layer is generally made of an Mg/Ag alloy, and is made very thin to ensure the transmittance. This results in an increase in square resistance of the cathode layer. Therefore, an auxiliary electrode is needed to reduce the square resistance of the cathode layer. However, currently a preparation process of the auxiliary electrode and a connection process between the auxiliary electrode and the cathode layer are complicated, which is not conducive to simplifying a manufacturing process of the OLED display panel.

SUMMARY

Embodiments of the present disclosure provide a display panel having a display area and a non-display area surrounding the display area, the display panel including:
  a base substrate;
  an auxiliary electrode disposed on the base substrate and in the non-display area;
  a passivation layer disposed on a side, facing away from the base substrate, of the auxiliary electrode, and provided with a first opening in the non-display area; in the first opening, an accommodating space is formed between the passivation layer and the auxiliary electrode, the accommodating space exposes at least part of the auxiliary electrode; and an orthographic projection of the passivation layer on the base substrate covers an orthographic projection of the accommodating space on the base substrate; and
  a cathode layer disposed on a side, facing away from the base substrate, of the passivation layer, and provided with a connecting portion in the accommodating space, the connecting portion being electrically connected to the auxiliary electrode.

In some embodiments, in the first opening, the passivation layer is provided with a first notch, and the accommodating space includes the first notch.

In some embodiments, in the first opening, the auxiliary electrode is provided with a second notch, and the accommodating space includes the second notch.

In some embodiments, the auxiliary electrode includes a first metal layer and a second metal layer stacked successively, the second metal layer is partially shortened with respect to the first metal layer to form the second notch.

In some embodiments, an orthographic projection of the first metal layer on the base substrate covers the orthographic projection of the accommodating space on the base substrate.

In some embodiments, the display panel further includes:
  a planarization layer disposed between the passivation layer and the cathode layer, and provided with a second opening; an orthographic projection of the second opening on the base substrate covering an orthographic projection of the first opening on the base substrate; and
  a pixel defining layer disposed between the planarization layer and the cathode layer, and provided with a third opening; an orthographic projection of the third opening on the base substrate covering the orthographic projection of the first opening on the base substrate;
  edges of the first opening, the second opening and the third opening rise stepwise.

In some embodiments, the orthographic projection of the second opening on the base substrate covers the orthographic projection of the accommodating space on the base substrate.

In some embodiments, the display panel further includes an organic functional layer disposed between the pixel defining layer and the cathode layer;
  in the first opening, the organic functional layer is broken at the accommodating space.

In some embodiments, the display panel further includes:
  a connecting terminal, in the non-display area of the base substrate, electrically connected to the auxiliary electrode, and configured to supply power to the auxiliary electrode.

In some embodiments, the display panel further includes source-drain electrodes in the display area of the base substrate; the auxiliary electrode is prepared in a same layer as the source-drain electrodes.

In some embodiments, the auxiliary electrode is an annular electrode surrounding the display area, and the first opening is an annular opening surrounding the display area.

In another aspect, embodiments of the present disclosure further provide a method for preparing the display panel as described in any of the above implementations, including:
  successively forming a pattern of the auxiliary electrode and a pattern of the passivation layer over the base substrate;
  applying a voltage to the auxiliary electrode; and
  evaporating a cathode material on the passivation layer; the cathode material carries charges that are electrically opposite to the voltage applied to the auxiliary electrode; and the cathode material, when being evaporated, is attracted to the accommodating space by the auxiliary electrode.

In yet another aspect, embodiments of the present disclosure further provide a display device including the display panel in any of the above implementations.

BRIEF DESCRIPTION OF THE DRAWINGS

FIG. 5B is a partial sectional structure diagram of an auxiliary electrode and a passivation layer of a display panel provided in an embodiment of the present disclosure after a second notch is formed by etching;

FIG. 5C is a partial sectional structure diagram of an auxiliary electrode and a passivation layer of a display panel provided in an embodiment of the present disclosure after a first notch is formed by etching;

FIG. 6 is a flow diagram of a method for preparing a display panel provided in an embodiment of the present disclosure.

DETAILED DESCRIPTION OF THE EMBODIMENTS

Figure 1:
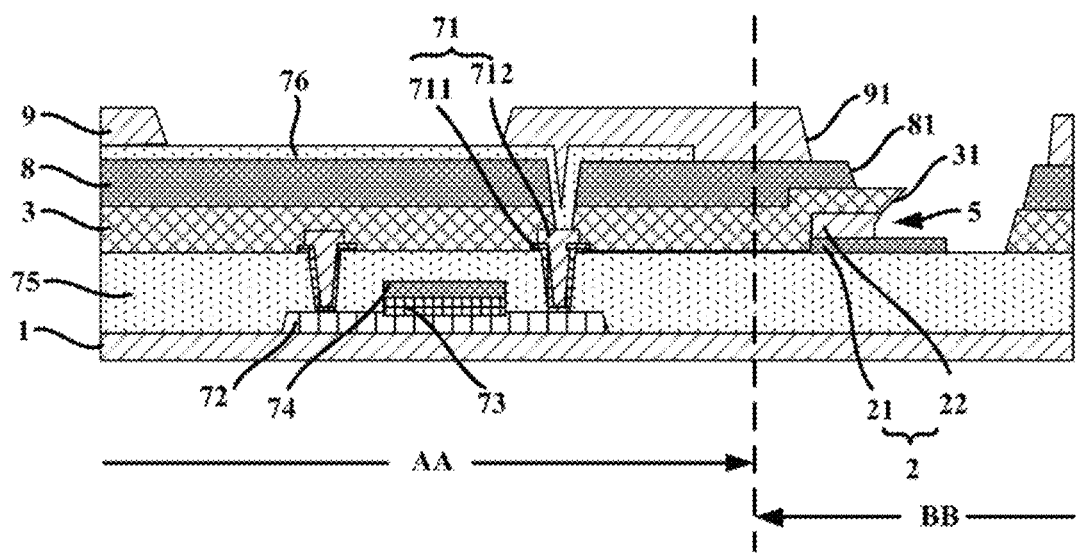
FIG. 1 is a partial sectional structure diagram of a display panel provided in an embodiment of the present disclosure.

Technical solutions in embodiments of the present disclosure will be described below clearly and completely in conjunction with the accompanying drawings in the embodiments of the present disclosure. Obviously, the described embodiments are only a part of embodiments of the present application, and not all the embodiments. Based on the embodiments in the present disclosure, all other embodiments obtained by those of ordinary skill in the art without any creative work fall within the protection scope of the present disclosure.

As shown in FIGS. 1 to 4, embodiments of the present disclosure provide a display panel provided with a display area AA and a non-display area BB surrounding the display area AA.

The display panel includes:
a base substrate 1;
an auxiliary electrode 2 disposed on the base substrate 1 and in the non-display area BB;
a passivation layer 3 disposed on a side, facing away from the base substrate 1, of the auxiliary electrode 2, and provided with a first opening 31 in the non-display area BB, here in the first opening 31, an accommodating space 5 is formed between the passivation layer 3 and the auxiliary electrode 2, the accommodating space 5 exposes at least part of the auxiliary electrode 2; and an orthographic projection of the passivation layer 3 on the base substrate 1 covers an orthographic projection of the accommodating space 5 on the base substrate 1; and
a cathode layer 4 disposed on a side, facing away from the base substrate 1, of the passivation layer 3, and provided with a connecting portion 41 in the accommodating space 5, the connecting portion 41 being electrically connected to the auxiliary electrode 2.

Figure 4:
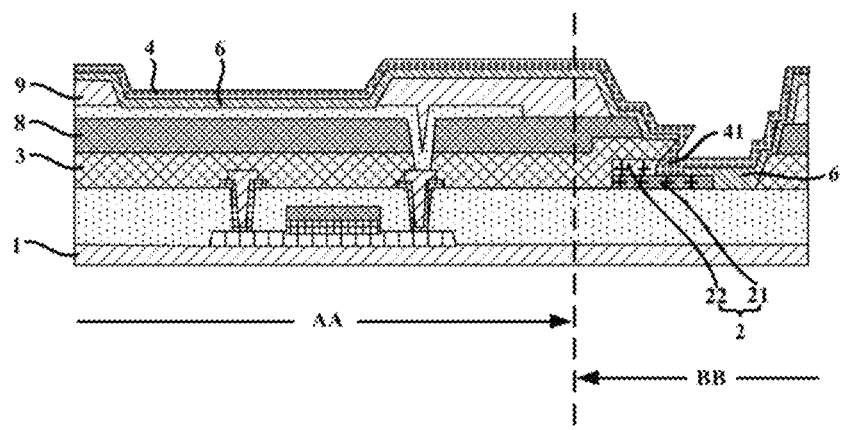
FIG. 4 is another partial sectional structure diagram of a display panel provided in an embodiment of the present disclosure.

In some embodiments, the non-display area BB of the base substrate 1 is provided with the auxiliary electrode 2. The auxiliary electrode 2 is disposed between the base substrate 1 and the passivation layer 3. The auxiliary electrode 2 can be prepared simultaneously with any metal layer (for example, a metal layer of source-drain electrodes 71 in FIG. 1) between the base substrate 1 and the passivation layer 3 to simplify the preparation process. Furthermore, the passivation layer 3 is provided with the first opening 31 that exposes the auxiliary electrode 2. The accommodating space 5 is formed between the auxiliary electrode 2 and the passivation layer 3 in the first opening 31. The orthographic projection of the passivation layer 3 covers the accommodating space 5. Therefore, as shown in FIG. 2, in evaporation of the organic functional layer 6, the organic functional layer 6 does not enter the accommodating space 5, which means that it does not cover the auxiliary electrode 2 in the accommodating space 5. In the formation of the cathode layer 4, as shown in FIG. 4, the connecting portion 41 can be formed in the accommodating space 5 to electrically connect the cathode layer 4 with the auxiliary electrode 2 in the accommodating space 5, thereby achieving the effect of reducing resistance of a cathode (including the cathode layer 4 and the auxiliary electrode 2). In the above-mentioned display panel, the connection between the cathode layer 4 and the auxiliary electrode 2 can be achieved without processing the organic functional layer 6, so the resistance of the OLED cathode can be reduced effectively, and the manufacturing process is convenient to implement without adding new process equipment.

In some embodiments, the above-mentioned display panel provided in the embodiment of the present disclosure may further include a connecting terminal (pad), in the non-display area BB of the base substrate 1, and the connecting terminal is electrically connected to the auxiliary electrode 2 to supply power to the auxiliary electrode 2. In some embodiments, the connecting terminal may be located in a circuit testing or binding area at the periphery of the non-display area BB, for supplying power by a prickling probe.

In some embodiments, after the organic functional material is evaporated, the next step is to evaporate a metal cathode material. In this process, if the cathode material is directly evaporated by using a normal evaporation method, the cathode material that can enter the accommodating space is very little, which is very likely to generate a break in the cathode, eventually resulting in that the auxiliary electrode is not fully connected with the cathode layer, and thus cannot function to reduce the cathode resistance.

Figure 3:
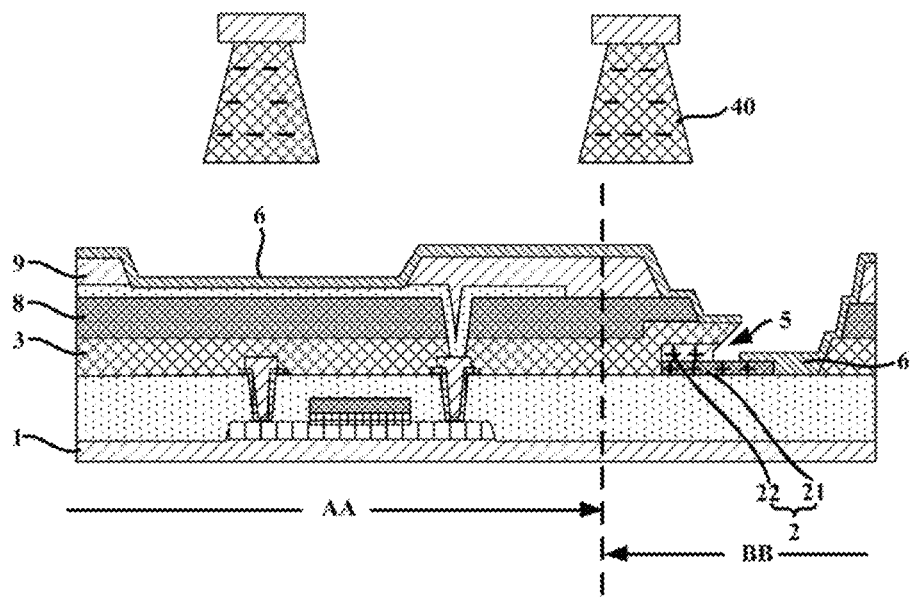
FIG. 3 is a partial sectional structure diagram of a display panel provided in an embodiment of the present disclosure in a state of evaporating a cathode layer.

In embodiments of the present disclosure, the auxiliary electrode 2 can be supplied with power by a prickling probe through the connecting terminal; and as shown in FIGS. 3 and 4, during the process of evaporation of the cathode material, by supplying power to the auxiliary electrode 2 of the OLED panel, a positive voltage (or a negative voltage) is applied to the auxiliary electrode 2, and at the same time, molecules of the evaporated cathode material 40 are negatively charged (or positively charged), and the accommodating space 5 in the first opening 31 will be filled with the cathode material 40 due to mutual attraction between charges of different polarities, so that the prepared cathode layer 4 is fully connected with the auxiliary electrode 2. By adopting the above method, the cathode material 40 can be deposited directionally, so that the cathode layer 4 is fully connected with the auxiliary electrode 2 while keeping the film layer complete, and thus the cathode resistance can be reduced.

Exemplarily, charging the molecules of the evaporated cathode material can be implemented by adding an evaporation cloud electrifying module under an evaporation source, so that the evaporated cathode material carries charges. This method has been implemented in some technologies, and will not be described here.

Of course, embodiments of the present disclosure are only an example for illustrating the directional deposition of the cathode layer, and the display panel of the present disclosure may also use other methods to implement the directional deposition of the cathode material.

Figure 7:
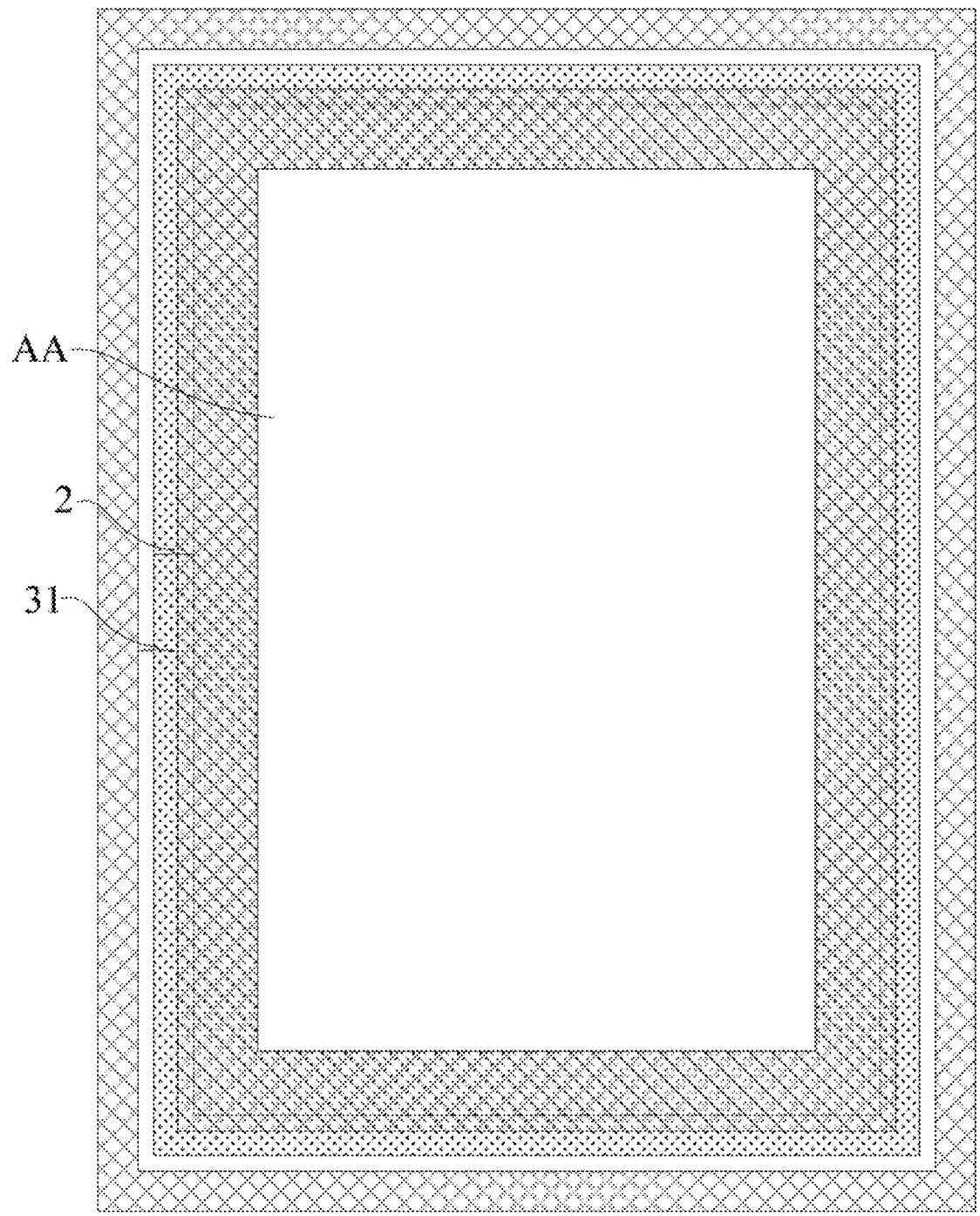
FIG. 7 is a top view of a relative positional relationship between an auxiliary electrode and a first opening of a passivation layer in a display panel provided in an embodiment of the disclosure.

In some embodiments, as shown in FIG. 7, the auxiliary electrode 2 may be an annular electrode surrounding the display area AA, to be favorable for increasing the area of the auxiliary electrode 2 and minimize the resistance of the cathode layer. Correspondingly, the first opening 31 corresponds to the position of the auxiliary electrode 2, and the first opening 31 may be an annular opening surrounding the display area AA to facilitate the cathode material entering the accommodating space 5 through the first opening 31. Exemplarily, an orthographic projection of the first opening 31 on the base substrate 1 partially overlaps an orthographic projection of the auxiliary electrode 2 on the base substrate 1, or is close to an edge of the orthographic projection of the auxiliary electrode 2 on the base substrate 1. Further, the accommodating space 5 in the first opening 31 may also be annular to increase an exposed area of the auxiliary electrode 2 and facilitate improving the electric connection yield between the cathode layer 4 and the auxiliary electrode 2.

In some embodiments, as shown in FIG. 5C, in the first opening, the passivation layer 3 is provided with a first notch 51, and the accommodating space 5 includes the first notch 51. The preparation of the first notch 51 can be implemented by an etching process. In some embodiments, an edge of the passivation layer 3 may be etched laterally, so that a side of the passivation layer 3 is recessed obliquely to form the first notch 51.

In some embodiments, as shown in FIGS. 5B and 5C, in the first opening, the auxiliary electrode 2 is provided with a second notch 52, and the accommodating space 5 includes the second notch 52. The second notch 52 may also be achieved by an etching process.

In some embodiments, as shown in FIGS. 1 to 5C, the auxiliary electrode 2 includes a first metal layer 21 and a second metal layer 22 stacked successively; and the second metal layer 22 is partially shortened with respect to the first metal layer 21 to form the second notch 52.

Exemplarily, as shown in FIGS. 1 to 5C, an orthographic projection of the first metal layer 21 on the base substrate 1 covers the orthographic projection of the accommodating space 5 on the base substrate 1, which can increase the area of the first metal layer 21 exposed by the accommodating space 5, that is, increase the area of the auxiliary electrode 2 exposed by the accommodating space 5, thereby facilitating improving the electrical connection yield between the cathode layer 4 and the auxiliary electrode 2.

Figure 5A:
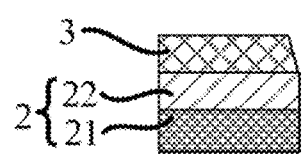
FIG. 5A is a partial sectional structure diagram of an auxiliary electrode and a passivation layer of a display panel provided in an embodiment of the present disclosure before an accommodating space is formed by etching.

Exemplarily, the preparation process of the accommodating space 5 may include: as shown in FIG. 5A, successively forming patterns of the first metal layer 21, the second metal layer 22 and the passivation layer 3 over the base substrate 1, and then performing a selective wet etching process so that the second metal layer 22 is partly shortened to form the second notch 52, as shown in FIG. 5B; and subsequently, performing a selective wet etching process so that an edge of the first opening of the passivation layer 3 is inclined laterally to form the first notch 51, as shown in FIG. 5C.

In some embodiments, in the display panel provided by the present disclosure, the first metal layer 21 and the second metal layer 22 of the auxiliary electrode 2 may be made of a low-resistivity metal material, such as copper.

Figure 2:
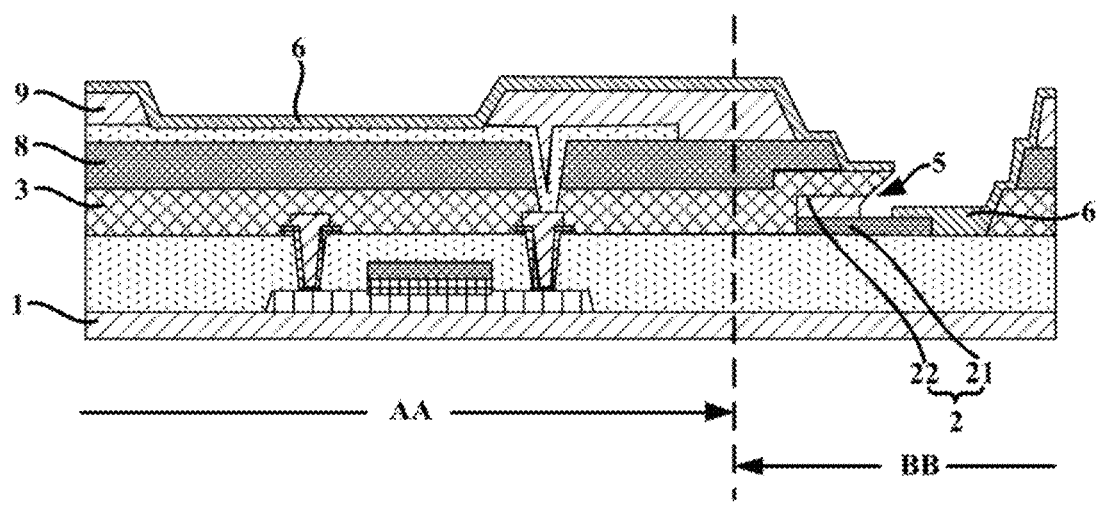
FIG. 2 is another partial sectional structure diagram of a display panel provided in an embodiment of the present disclosure.

As shown in FIG. 1, in some embodiments, the display panel provided in the present disclosure may include source-drain electrodes 71 in the display area AA of the base substrate 1. Exemplarily, the source-drain electrodes 71 have double layer structures 711 and 712, and the double layer structures 711 and 712 are respectively made of the same material and prepared in the same layer as the first metal layer 21 and the second metal layer 22, that is, the auxiliary electrode 2 and the source-drain electrodes 71 are prepared in the same layer. In this way, there is no need to add a new process and a new material to form the auxiliary electrode 2, so it is simple in process, and cost-saving.

As shown in FIGS. 1 to 4, in a implementation, the display panel of embodiments of the present disclosure may further include: a planarization layer 8 disposed between the passivation layer 3 and the cathode layer 4, and provided with a second opening 81 corresponding to the first opening 31, that is, an orthographic projection of the second opening 81 on the base substrate 1 covers the orthographic projection of the first opening 31 on the base substrate 1; and a pixel defining layer 9 disposed between the planarization layer 8 and the cathode layer 4, and provided with a third opening 91 corresponding to the first opening 31, that is, an orthographic projection of the third opening 91 on the base substrate 1 covers the orthographic projection of the first opening 31 on the base substrate 1. And, the second opening 81 and the third opening 91 have the same functions as the first opening 31, all of which are to enable the metal cathode material to enter the accommodating space 5.

Exemplarily, edges of the first opening 31, the second opening 81 and the third opening 91 rise stepwise, that is, opening edges of the first opening 31, the second opening 81 and the third opening 91 increase stepwise. This can avoid the generation of a break in the cathode layer 4 due to a large fault.

Exemplarily, the orthographic projection of the second opening 81 on the base substrate 1 covers the orthographic projection of the accommodating space 5 on the base substrate 1. That is, an opening range of the planarization layer 8 covers the accommodating space 5, and the structures of the planarization layer 8 and the pixel defining layer 9 are not provided above the accommodating space 5. This can avoid deformation or collapse that occurs as the passivation layer 3 above the accommodating space 5 is too thin to effectively support the organic planarization layer 8 and the pixel defining layer 9.

As shown in FIGS. 2 to 4, in a implementation, the display panel of embodiments of the present disclosure may further include an organic functional layer 6 disposed between the pixel defining layer 9 and the cathode layer 4. Specifically, as shown in FIG. 2, since the orthographic projection of the passivation layer 3 on the base substrate 1 covers the accommodating space 5 on the base substrate 1, the organic functional layer 6 does not enter the accommodating space 5 during evaporation of the organic functional layer 6, and even if it can enter, the entering amount is very small. Therefore, the organic functional layer 6 is broken at the accommodating space 5, which is embodied as a break at an edge of the first opening 31. However, as shown in FIGS. 3 and 4, in evaporation of the cathode material 40, directional deposition can be achieved by mutual attraction between charges of different polarities, so that the metal cathode material 40 is attracted into the accommodating space 5 and deposited in the accommodating space 5, thereby ensuring that the cathode layer 4 is complete and fully connected with the auxiliary electrode 2, and thus reducing the cathode resistance.

Exemplarily, as shown in FIG. 1, the display panel provided in the present disclosure may further include, in the display area AA of the base substrate 1, an active layer 72, a gate insulating layer 73, a gate 74, an etch barrier layer 75, an anode 76, and other structures, which are not described here one by one.

Based on the same inventive concept, embodiments of the present disclosure further provides a method for preparing a display panel, as shown in FIG. 6, the method including the following steps:

step 101, as shown in FIG. 1, successively forming a pattern of an auxiliary electrode 2 and a pattern of a passivation layer 3 over a base substrate 1;

step 102, as shown in FIG. 3, applying a voltage to the auxiliary electrode 2; and step 103, as shown in FIGS. 3 and 4, evaporating a cathode material on the passivation layer 3;

the evaporated cathode material carrying charges that are electrically opposite to the voltage applied to the auxiliary electrode 2, and the cathode material, when being evaporated, is attracted to the accommodating space 5 by the auxiliary electrode 2.

Exemplarily, as shown in FIG. 2, before the cathode layer is evaporated, that is, before step 102, the above preparation method further includes a step of evaporating an organic functional layer 6. Specifically, as shown in FIG. 2, since the orthographic projection of the passivation layer 3 on the base substrate 1 covers the orthographic projection of the accommodating space 5 on the base substrate 1, the organic functional layer 6 does not enter the accommodating space 5 during evaporation of the organic functional layer 6, and even if it can enter, the entering amount is very small. Therefore, the organic functional layer 6 is broken at the accommodating space 5, which is embodied as a break at an edge of the first opening.

Further, in embodiments of the present disclosure, during the process of evaporation of the cathode material, as shown in FIGS. 3 and 4, by supplying power to the auxiliary electrode 2 of the OLED panel, a positive voltage (or a negative voltage) is applied to the auxiliary electrode 2, and at the same time, molecules of the evaporated cathode material are negatively charged (or positively charged), and the accommodating space 5 in the first opening 31 will be filled with the cathode material due to mutual attraction between charges of different polarities, so that the prepared cathode layer 4 is fully connected with the auxiliary electrode 2. By adopting the above method, the cathode material can be deposited directionally, so that the cathode layer 4 is fully connected with the auxiliary electrode 2 while keeping the film layer complete, and thus the cathode resistance can be reduced.

Exemplarily, a connecting terminal can be designed at the periphery of the display panel to supply power to the auxiliary electrode by a prickling probe.

Exemplarily, charging the molecules of the evaporated cathode material can be implemented by adding an evaporation cloud electrifying module under an evaporation source, so that the evaporated cathode material carries charges. This method has been implemented in some technologies, and will not be described here.

Of course, embodiments of the present disclosure are only an example for illustrating the directional deposition of the cathode layer, and the display panel of the present disclosure may also use other methods to implement the directional deposition of the cathode material.

Exemplarily, the preparation process of the accommodating space 5 may include: as shown in FIG. 5A, successively forming patterns of a first metal layer 21, a second metal layer 22 and the passivation layer 3 over the base substrate 1, and then performing a selective wet etching process so that the second metal layer 22 is partly shortened to form a second notch 52, as shown in FIG. 5B; and subsequently, performing a selective wet etching process so that an edge of the first opening 31 of the passivation layer 3 is inclined laterally to form a first notch 51, as shown in FIG. 5C.

In some embodiments, the method for preparing the display panel provided in embodiments of the present disclosure may adopt the same implementations as the display panel of embodiments of the present disclosure, and has the same beneficial effects as the display panel of embodiments of the present disclosure, which will not be repeated here.

In addition, embodiments of the present disclosure further provide a display device including the display panel in any of the above implementations.

The type of the display device provided in embodiments of the present disclosure may be, for example, a mobile phone, a laptop computer, an e-book reader, a tablet computer or the like.

It will be apparent to those skilled in the art that various modifications and variations can be made in embodiments the present disclosure without departing from the spirit or scope of the present disclosure. Thus, it is intended that the present disclosure covers the modifications and variations if these modifications and variations of the present disclosure come within the claims of the present disclosure and the scope of their equivalents.

What is claimed is:

1. A method for preparing a display panel, wherein the display panel is provided with a display area and a non-display area surrounding the display area;

wherein the display panel comprises: a base substrate; an auxiliary electrode disposed on the base substrate and in the non-display area, a passivation layer disposed on a side, facing away from the base substrate, of the auxiliary electrode, and provided with a first opening in the non-display area, wherein in the first opening, an accommodating space is formed between the passivation layer and the auxiliary electrode, the accommodating space exposes at least part of the auxiliary electrode; and an orthographic projection of the passivation layer on the base substrate covers an orthographic projection of the accommodating space on the base substrate; and a cathode layer disposed on a side, facing away from the base substrate, of the passivation layer, and provided with a connecting portion in the accommodating space, the connecting portion being electrically connected to the auxiliary electrode;

wherein the method comprises:

successively forming a pattern of the auxiliary electrode and a pattern of the passivation layer over the base substrate;

applying a voltage to the auxiliary electrode; and evaporating a cathode material on the passivation layer;

wherein the cathode material carries charges that are electrically opposite to the voltage applied to the auxiliary electrode, and the cathode material, when being evaporated, is attracted to the accommodating space by the auxiliary electrode.

2. The method according to claim 1, wherein in the first opening, the passivation layer is provided with a first notch, and the accommodating space comprises the first notch.

3. The method according to claim 1, wherein in the first opening, the auxiliary electrode is provided with a second notch, and the accommodating space comprises the second notch.

4. The method according to claim 3, wherein the auxiliary electrode comprises a first metal layer and a second metal layer stacked successively, the second metal layer is partially shortened with respect to the first metal layer to form the second notch.

5. The method according to claim 4, wherein an orthographic projection of the first metal layer on the base substrate covers the orthographic projection of the accommodating space on the base substrate.

6. The display panel according to claim 1, wherein the display panel further comprises:
- a planarization layer disposed between the passivation layer and the cathode layer, and provided with a second opening; an orthographic projection of the second opening on the base substrate covering an orthographic projection of the first opening on the base substrate; and
- a pixel defining layer disposed between the planarization layer and the cathode layer, and provided with a third opening; an orthographic projection of the third opening on the base substrate covering the orthographic projection of the first opening on the base substrate;
- wherein edges of the first opening, the second opening and the third opening rise stepwise.

7. The method according to claim 6, wherein the orthographic projection of the second opening on the base substrate covers the orthographic projection of the accommodating space on the base substrate.

8. The method according to claim 6, wherein the display panel further comprises:
- an organic functional layer disposed between the pixel defining layer and the cathode layer;
- wherein in the first opening, the organic functional layer is broken at the accommodating space.

9. The method according to claim 1, wherein the display panel further comprises:
- source-drain electrodes in the display area of the base substrate;
- wherein the auxiliary electrode is prepared in a same layer as the source-drain electrodes.

10. The method according to claim 1, wherein the auxiliary electrode is an annular electrode surrounding the display area, and the first opening is an annular opening surrounding the display area.

* * * * *